United States Patent
Chim et al.

(10) Patent No.: US 8,285,521 B1
(45) Date of Patent: Oct. 9, 2012

(54) CERTIFICATION CONTROLS FOR A STRUCTURE DESIGN, ANALYSIS, AND IMPLEMENTATION SYSTEM

(75) Inventors: Nicholas Chim, San Francisco, CA (US); Eric Teller, San Francisco, CA (US); Eli Attia, Palo Alto, CA (US); Michelle Kaufmann, Novato, CA (US); Alena Fong, Fremont, CA (US); Augusto Roman, Mt. View, CA (US); Jennifer Carlile, San Francisco, CA (US); Cedric Dupont, San Francisco, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/237,735

(22) Filed: Sep. 20, 2011

(51) Int. Cl.
  *G06F 17/50* (2006.01)
(52) U.S. Cl. .......................................................... 703/1
(58) Field of Classification Search ................... 700/98; 703/1
  See application file for complete search history.

(56) References Cited

U.S. PATENT DOCUMENTS

| | | | |
|---|---|---|---|
| 5,535,320 | A | 7/1996 | Gay et al. |
| 6,859,768 | B1 * | 2/2005 | Wakelam et al. ............... 703/1 |
| 2006/0075718 | A1 | 4/2006 | Borne et al. |
| 2009/0234696 | A1 | 9/2009 | Attia |
| 2010/0070241 | A1 * | 3/2010 | Opdahl et al. ................. 703/1 |
| 2010/0257457 | A1 | 10/2010 | DeGoes |
| 2011/0010134 | A1 | 1/2011 | Balla et al. |
| 2011/0047484 | A1 | 2/2011 | Mount et al. |
| 2011/0054652 | A1 * | 3/2011 | Heil ............................ 700/98 |
| 2011/0191069 | A1 * | 8/2011 | Madsen et al. ............... 703/1 |

OTHER PUBLICATIONS

Anderson, Lee, et al. "A Virtual Environment for Conceptual Design in Architecture", International Immersive Projection Technologies Workshop, Eurographics Workshop on Virtual Environments (2003).
Larson, K, chapter titled "Open Source Living", Building (in) The Future: Recasting Labor in Architecture, ed. Deamer and Bernstein, pp. 100-113 (Yale School of Arch., 2010).
Onuma Systems products—info at http://onuma.com/products/OnumaPlanningSystem.php (May 6, 2010).
Digital Project, Gehry Technologies—info at http://www.gehrytechnologies.com/index.php?option=com_content&task=view&id=97&Itemid=211 (2011).
Autodesk Revit—info at http://usa.autodesk.com/revit-architecture/ (2011).
Autodesk Vasari—info at http://labs.autodesk.com/utilities/vasari/ (2011).

(Continued)

*Primary Examiner* — Dwin M Craig
*Assistant Examiner* — Bernard E Cothran
(74) *Attorney, Agent, or Firm* — Jonathan A. Small

(57) ABSTRACT

A computer-implemented subsystem and method is disclosed for receiving user qualification data, comparing that data to certification criteria, and providing user certification according thereto, in the context of a system for designing a structure. A variety of users may be certified, including architects, designers, component and service providers, permitting authorities, builders, financers, future tenants, etc. A wide variety of certifications may be provided including by trade, by attributes of the structure, by intended use of the design system, etc. Certification may be based on general experience, references, time spent with the design system, training completed, examination passed, other certifications, etc. Certification may be stand-alone or may be part of an ongoing continuing education process. The design system may limit actions a user may perform on a design based on certification and certification level. Certified users may be connected with clients and other opportunities through the design system or otherwise.

23 Claims, 8 Drawing Sheets

OTHER PUBLICATIONS

Autodesk Ecotect Analysis—info at http://usa.autodesk.com/adsk/servlet/pc/index?siteID=123112&id=12602821 (2011).

Autodesk AutoCAD—info at http://usa.autodesk.com/autocad/ (2011).

Duke University open source structural analysis package—info at http://frame3dd.sourceforge.net/ (Sep. 13, 2011).

Graphisoft ArchiCAD—info at http://www.graphisoft.com/products/archicad/ (2011).

Chen, P. et al., "Implementation of IFC-based web server for collaborative building design between architects and structural engineers", Auto. in Constr., vol. 14, pp. 115-128 (Elsevier, Aug. 27, 2004).

Setareh, m. et al., "Development of a collaborative design tool for structural analysis in an immersive virtual environment", pp. 1-6, (Virginia Poly Tech. Inst. and State Univ., Feb. 14, 2011).

Luo, Y. "Cooperative Design in Building Construction", pp. 93-108 (Univ. Balearic Islands, Spain, May 10, 2007).

Scheer, S. "Building design teamwork supported by a collaborative CAD modeling process analysis", (Nottingham Univ. Press, May 30, 2010).

U.S. Appl. No. 13/112,727, filed May 20, 2011, Teller et al.
U.S. Appl. No. 13/163,307, filed Jun. 17, 2011, Teller et al.
U.S. Appl. No. 13/418,302, filed Mar. 12, 2012, Teller et al.
U.S. Appl. No. 13/163,424, filed Jun. 17, 2011, Teller et al.
U.S. Appl. No. 13/211,225, filed Aug. 16, 2011, Kaufmann et al.
U.S. Appl. No. 13/237,681, Sep. 20, 2011, Chim et al.
U.S. Appl. No. 13/342,162, filed Jan. 2, 2012, Teller et al.

* cited by examiner

| | |
|---|---|
| User Name | F. L. Wright |
| Desired certification | Architect |
| Currently licensed architect | ● Yes  ○ No |
| If yes, date of license | January 15, 1992 |
| Other certifications? | n/a |
| Hours spent working with Acme system | 400 |
| Projects completed  Type | Commercial |
| Location | Metro |
| Size | 10,000 ft² |
| Supervised by certified user? | ● Yes  ○ No |
| Additional projects? | ○ Yes  ● No |

CERTIFICATION CONTROLS FOR A STRUCTURE DESIGN, ANALYSIS, AND IMPLEMENTATION SYSTEM

CROSS-REFERENCE TO RELATED APPLICATIONS

The present disclosure is related to and claims priority from copending U.S. patent application titled "System and Methods for Structure Design, Analysis, and Implementation", Ser. No. 13/112,727, filed on May 20, 2011, which is incorporated herein by reference. The present disclosure is also related to U.S. patent application titled "System and Methods Facilitating Collaboration in the Design, Analysis, and Implementation of a Structure", Ser. No. 13/163,307, which is incorporated herein by reference.

COPYRIGHT NOTICE

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND

The present disclosure is related to the design and realization of structures such as buildings, and more specifically to systems and methods for certifying users in the context of a system for designing, iterating, and building such structures, and supporting the ecosystem of the processes and the parties participating in those operations.

Traditionally, the process of designing and building a structure involves many professionals with many different skill sets. As an example, a developer interested in having a commercial structure built may retain an architect, who takes the developer's requirements and preferences, details about the site, building codes and the like, and first generates a conceptual design, then a more detailed schematic design. At this stage, the architect's role is to synthesize, problem solve, and design. The resulting forms, as drawn and/or modeled, are typically a blending of art and engineering. Reviews and reworking for multiple different audiences typically occur next in what is often referred to as design development. For example, an architectural engineer or similar professional may review the design and plans for the proposed structure's integrity and safety, the developer may have input for modifications to the design to meet a desired design goal, the builder may introduce limitations based on cost, time-to-completion, feasibility, and so on.

Portions of the design may also be sent to sources for cost estimates, design refinement, to determine availability of elements of the structure, estimates for time-to-delivery of components, etc. Input from these many other sources may then also be factored into calculated time-to-completion, cost, and so on. Bidding and negotiation may take place, such as with a builder or construction manager, parts and services providers, etc. Further design development then typically takes place to bring the design in line with budgets, evolving design requirements, etc.

Once the final design and plans converge for the main parties of interest (developer, architect, engineer, and builder, who form the core of the ecosystem for the project), required permits and other approvals may then be sought. An additional one or more round(s) of design development take place including negotiations with certifying and permitting agencies in order to converge on a mutually acceptable design. Ultimately, construction begins and in spite of inevitable cost and time overruns a structure is built. Importantly, many different parties have interacted with blueprints, build specifications, timelines, and so forth.

While there are many other steps and parties involved, and the actual order of things may vary from structure to structure, the process is long, convoluted, circular, often unnecessarily complex, with many parties involved, and there are many opportunities for inefficiencies and delays in the various design, interaction, revision, and iteration of the design and build process. Furthermore, for each new structure, the process essentially reinvents itself from scratch, but never the same from one structure to the next. There is little re-use of designs, processes, and data in the design and construction of new structures. And, there are few resources available to improve efficiency and effectiveness in the communication and work processes taking place in the community of people and agencies involved in the design and construction process.

Importantly, many different parties have interacted with the blueprints, build specifications, parts lists, timelines, and other documents and materials (as well as each other) required to design and build the structure. For many of the parties involved, a license, credential, or other evidence of qualification is required. For other parties involved, reputation or recommendation may be sufficient to qualify them for their part of the project. Still others may be employed without significant check for qualifications or relevant experience. The role of checking and confirming those parties' qualifications, certifications, etc. typically falls on one or more individuals or organizations in the structure design and building ecosystem.

SUMMARY

Accordingly, the present disclosure is directed to systems and methods for certifying users in the context of a system for designing, iterating, and building such structures, and supporting the ecosystem of the processes and the parties participating in those operations. As used herein, a "user" is intended to mean any entity that may interface with a system and methods for structure design, analysis, and implementation such as disclosed in the aforementioned U.S. patent application Ser. Nos. 13/112,727 and 13/163,307 (referred to herein as a "design system"). Therefore, a "user" may be animate (e.g., a human or group of humans) or inanimate (e.g., computer-based). Functions users may perform include, but are not limited to: architecture, design (e.g., interior, landscape, etc.), engineering (e.g., structural, seismic, etc.), component and system design and supply, construction management and building services, permitting and regulatory approvals, real estate presentation (e.g., multiple listing service), real estate brokerage, real estate development, development (and component and systems) financing, building tenancy, structure evaluation (e.g., juried artworks), structure, component, and system design clearinghouse, and so on. Each function may have specific aspects of interaction with the design system appropriate for certain types and/or levels of certification.

"Certification", "certified", "certify", and the like used herein are intended to mean attestation to an established level of experience, competence, training, level of study, and the like. A "certification" is a grant of permission, authority or similar measure, as determined by certification criteria, to a user or group of users. Certification may be of a type such as by title, of a level such as rank, years of experience, etc. or a combination of the two such as <level><title> (e.g., novice architect). Titles and levels may (or may not) match industry standard titles and levels, and may (or may not) represent similar skill sets.

According to one aspect of the disclosure, the attestation may be direct, in that an individual, organization, or subsystem must first be satisfied (such as by demonstrating user time spent with a design system, passing an examination, etc.) and then instruct an aspect of the design system to award certification. The attestation may also be indirect, in that if a user is certified with an individual or organization (such as a governmental license, certification, etc.), then that user is also certified within an aspect of the design system.

According to another aspect of the disclosure, a number of different types of certifications are contemplated. For example, certification may represent a level of competence, experience, and facility with the design system. This is referred to herein as "system-specific" certification. Certification may also represent a level of competence, experience, and facility in a relevant aspect of design and implementing a structure (such as plumbing or electrical, soil engineering, interior design, and so on). This is referred to as "field-specific" certification. General use of the term certification is intended to include system- and field-specific certifications, as well as other certifications, unless otherwise noted. Additional definitions are provided elsewhere herein.

According to one aspect of the disclosure, the system facilitates a close and effective working relationship between various parties involved in designing and implementing a structure. Skill level and facility with the design program as well as with the field in which the certification is granted may quickly be determined with reference to level of certification. Appropriate access and editing controls can be automated based on certification level. Qualified system and service providers may be readily identified from a database of certified users.

Accordingly, a computer-implemented method (and system) for assigning a user certification for interaction with a system for designing a structure and coordinating its implementation, comprises: receiving, in a subsystem communicatively connected to the computer-implemented system for designing a structure and coordinating its implementation, user identification data; receiving, in the subsystem, user qualification data associated with the user identification data; comparing, in the subsystem, the user qualification data to certification criteria; assigning a certification to the user identification data based on the comparison of the user qualification data and the certification criteria; and storing, in memory communicatively connected to the system for designing a structure and coordinating its implementation, an association between the assigned certification and the user identification data; whereby when a user proffers user identification data to the system, the system may authenticate the user for actions commensurate with the assigned certification.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings:

FIG. 6 is a sample user interface permitting a user to enter qualification data in a form usable by a certification subsystem according to an embodiment of the present disclosure.

DETAILED DESCRIPTION

We initially point out that description of well-known processes, components, equipment, and other well-known details are merely summarized or are omitted so as not to unnecessarily obscure the details of the present invention. Thus, where details are otherwise well known, we leave it to the application of the present disclosure and the knowledge and ability of one skilled in the art to suggest or dictate choices relating to those details.

Figure 1:
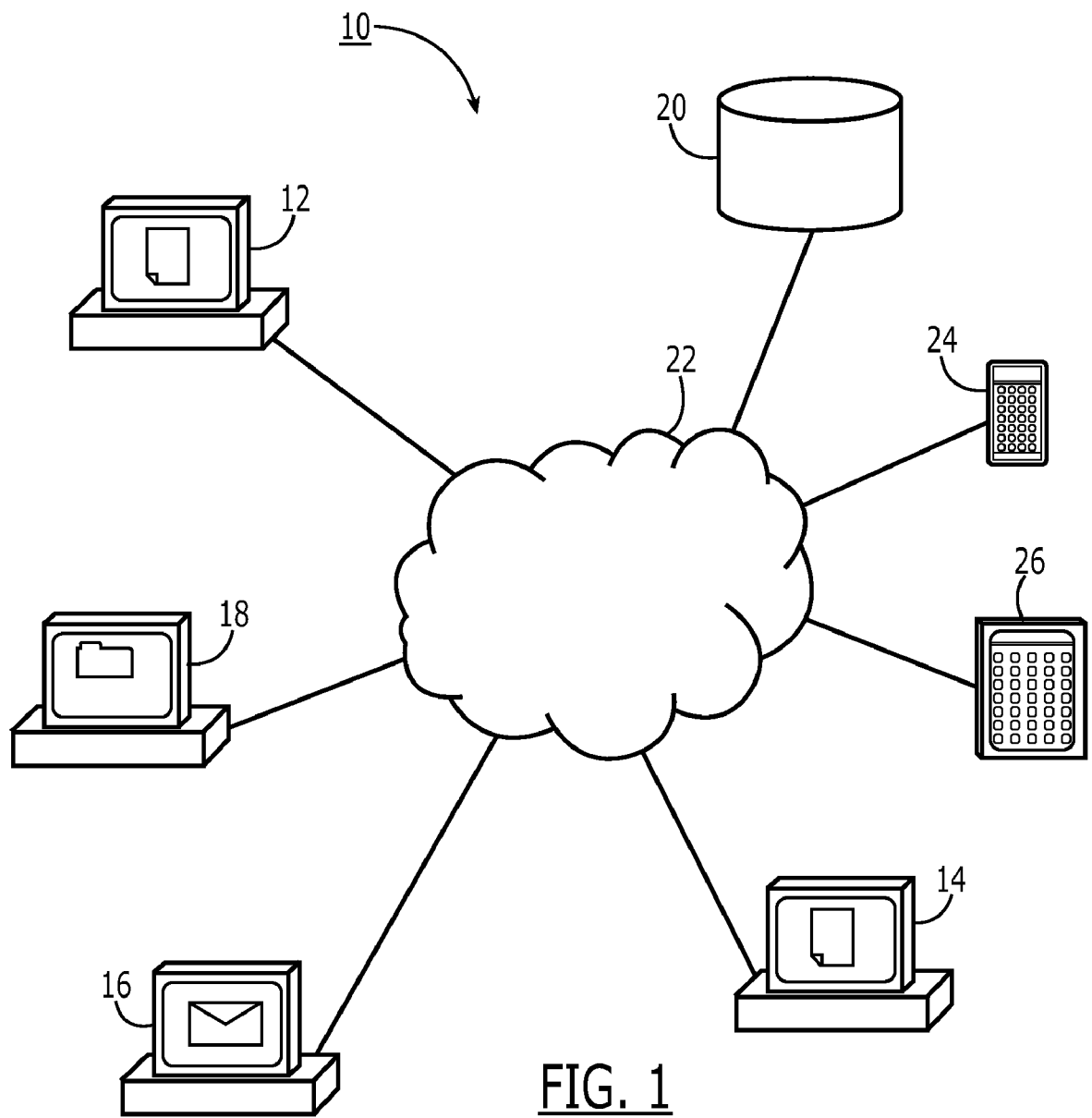
FIG. 1 is a high-level representation of a distributed network environment, comprising hardware and software, within which various embodiments of a subsystem for establishing a user certification and certification level and providing design control based on that certification and certification level according to the present disclosure may be employed.

With reference initially to FIG. 1, a distributed network environment 10 is shown, comprising hardware and software, within which various embodiments of the present disclosure may be employed. More specifically, distributed network environment 10 comprises multiple interconnected elements of hardware, each running software, allowing those elements of hardware to communicate with one another, whether by wired or wireless connection. Such elements of hardware include, but are not limited to, a first client workstation 12, a second client workstation 14, a mail server computer 16, a file server computer 18, and network appliances 20 such as remote storage, each communicating via the public Internet 22. The client workstations and servers generally may be referred to as computer devices. Other computer devices, such as mobile computationally-enabled telephone handsets (so called "smart phones") 24, tablet-style computer devices 26, and so on may also form a part of network environment 10.

Alternatives to using the public Internet, or additional interconnection mechanisms include local area networks (LANs), wide area networks (WANs), etc. Alternatives to client workstations, or additional computer mechanisms include personal computers, servers that are personal computers, minicomputers, personal digital assistants (PDAs), mainframes, etc. The network within which the various embodiments of the present disclosure operates may also comprise additional or fewer devices without affecting the scope of the present disclosure.

First and second client workstations 12, 14, smart phone 24, tablet computer 26, etc. may communicate via the public Internet 22 using known Web browser software or dedicated, specific-purpose application software. As is well known, software components supporting client workstations 12, 14, servers 16, 18, and network appliances 20, smart phone 24, and tablet computer 26 include or reference logic and/or data that may form a part of the software component or be embodied in or retrievable from some other hardware of software device or signal, either local or remote and coupled via a network or other data communications device.

Thus, embodiments of the invention may be implemented as methods, apparatus, or articles of manufacture as or in software, firmware, hardware, or any combination thereof. As used herein, article of manufacture (or alternatively, computer program product) is intended to encompass logic and/or data accessible from any computer-readable device, carrier, or media.

Those skilled in the art will recognize many modifications may be made to this exemplary environment without departing from the scope of the present disclosure. For example, it will be appreciated that aspects of the present disclosure are not dependent upon data structure formats, communications protocols, file types, operating systems, database management system, or peripheral device specifics. Accordingly, the following description is provided without reference to specific operating systems, protocols, or formats, with the understanding that one skilled in the art will readily be able to apply this disclosure to a system and format of choice.

The present disclosure is typically used in conjunction with a computer-implemented system and methods for producing a design of a structure and coordinating aspects of its implementation. As used herein, a "structure" may be, but is not limited to, habitable buildings, functional structures, artistic structures, and so on, and the nature of the structure does not form a limitation on the scope of the present disclosure. Furthermore, as used herein, "designing" is intended to mean all aspects of preparing plans for implementing a structure, including but not limited to developing a set of documents that describe a structure and aspects of its construction, as well as estimates relating to the design and construction of the structure. Designing a structure may optionally include designing or selecting the materials and processes for obtaining prerequisite certifications and approvals for constructing a structure. Still further as used herein, "implementation" is intended to mean verifying aspects of a design, arranging accessibility to required parts, services, and personnel, maintaining a project timeline, maintaining a project budget, managing changes during the build phase, financing and insurance, and constructing the structure. Optionally, implementation may also include coordinating and obtaining approvals, permits, and the like.

Figure 2:
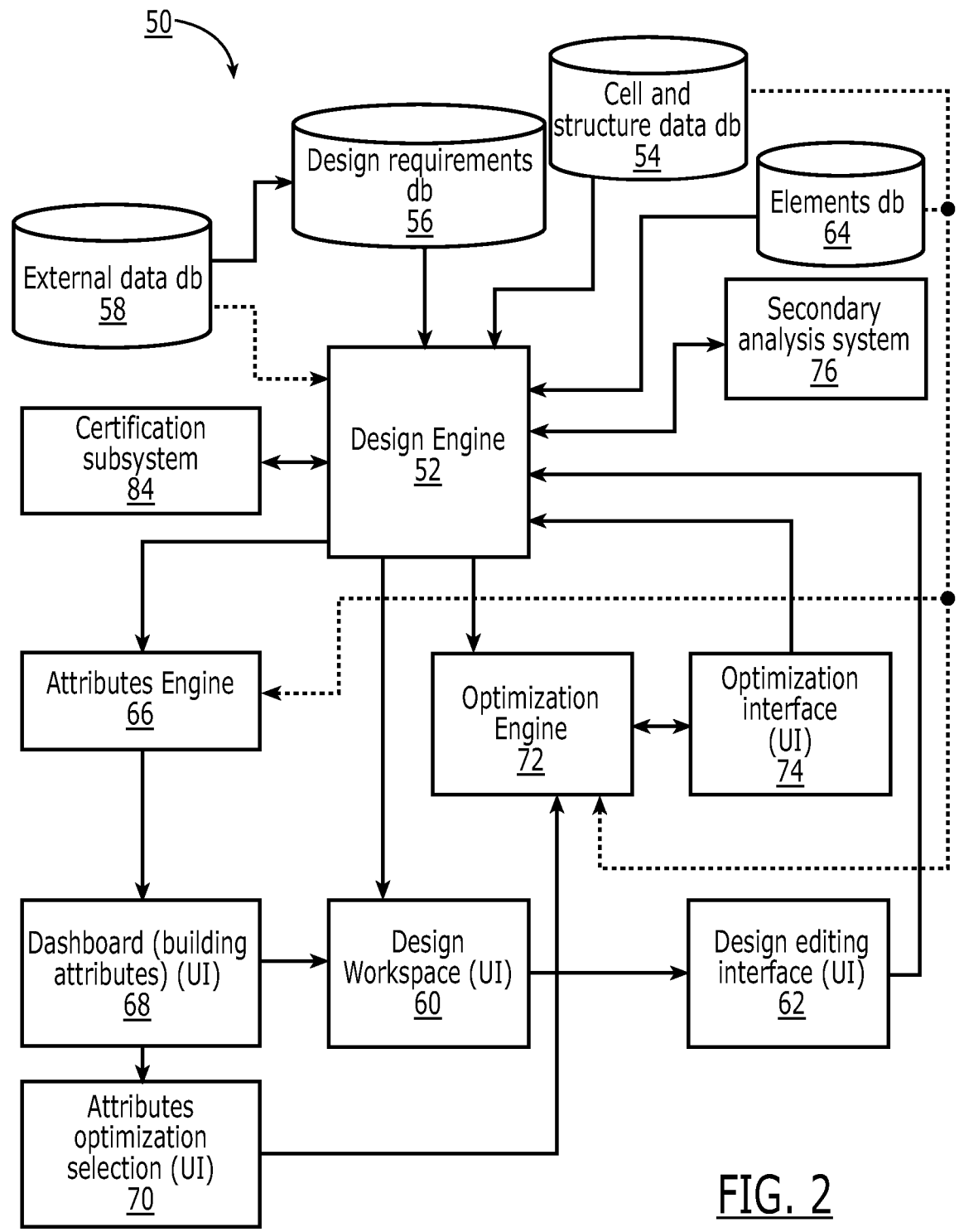
FIG. 2 is a schematic diagram of a portion of a first embodiment of a computer-implemented system for establishing a user certification and certification level and providing design control based on that certification and certification level according to the present disclosure.

One general embodiment in which the present disclosure operates is illustrated in FIG. 2, which is a schematic diagram of a portion of a computer-implemented system 50 for designing a structure and coordinating its implementation according to the present disclosure. Embodiment 50 comprises a design engine 52 that manages aspects of the structure design process. Design engine 52 may be realized in software, firmware, hardware, etc.

Design engine 52 receives various inputs including data from cell and structure data database 54, design requirements database 56, and optionally external content database 58 and elements database 64 interconnected thereto. While these data inputs are shown and discussed in terms of databases, it will be appreciated that other forms of data input, such as streaming data, real-time measurement data, calculated data, etc. may also be employed.

Design engine 52 provides an output in the form of data representing a structure that is rendered in a design workspace user interface (UI) 60. Design engine 52 may include rendering capabilities, or may rely on additional tools, such as Google SketchUp to perform rendering tasks. Design workspace UI 60 provides a user with a visual representation of the structure being designed, as well as a design-editing interface 62 at which a user may edit the design.

An attributes engine 66 receives design data from design engine 52 and calculates various attributes about the design, such as square footage, cost of construction, time to completion, and so on. Calculated attributes are provided for display in dashboard 110 (which may form a portion of design workspace 60). While certain attributes of the structure being designed may be determined from the rules underlying an individual cell, other attributes may only be determined when evaluating the entire structure (or at least only accurately determined). This is a consequence of the fact that a cell definition may be instantiated as many different cells by the many rules being invoked, and only after instantiation and assembly of cells can attributes such as cost, square footage, energy efficiency, and so on be determined. An interface 70 may be provided for optimizing the design to meet desired attribute targets.

System 50 may be configured to optimize the design produced by design engine 52 against various metrics. As mentioned above, in one embodiment, a user may specify target values for attributes in user interface 70. An optimization engine 72 receives design data from design engine 52, optimization selections such as from optimization interface 74, and optionally targets from user interface 70, and modifies aspects of the design, such as by using alternate cells rules, systems or components, changing the form or footprint of the design, reorienting the design on the building site, and so on. It then tests the design to determine if the modification produces an improved design against the optimization metrics. The modify-and-test process continues and improved designs are saved and further optimized, which those that are generally not improved are not retained. Iteratively, the optimized designs may be rendered in design workspace 60, and the attribute measures provided in dashboard 110 updated.

The concept of developing a structure using cells (or a similar construct) is fundamental and common to design systems referred to herein. Use of cells, and design engine 52 lend a high degree of automation to aspects of the structure design process. Cell and structure data database 54 may provide a set of generic rules that are used by design engine 52 for populating the structure footprint. These rules may be explicit or may be derived algorithmically. In one example, a rule might be that, all other things being equal, the secondary beams in each cell should run in the same directions as their neighboring cells. Another example might be that each cell has support structures (columns) in appropriate places within it, but when two cells are placed together, they abandon their redundant structure and each includes the shared columns and beams at their intersection (with the redundant material been removed from the design).

Thus, cells are abstractions of portions of a structure (although in certain cases a structure may in fact be comprised of a single cell) upon which other systems in the design depend. Cells are instantiated as part of the design process. Cells include rules governing aspects of the instantiations, such as how an instance of one cell connects to another instance, size ranges of instances, systems or components included in or required by an instance, and so on.

Cells are not pre-defined elements that form a portion of a structure. (By element, we mean one or more units that represent a physical part of the structure.) Rather, a cell, as used herein, is an abstraction defined by a set of rules that specify at least how one element of a structure connects to an adjacent element of the structure, and how one element affects the remaining elements of the structure when so connected. Therefore, when a user selects a cell from a cell source, the user is not selecting an element of the structure per se. Rather, the user is effectively selecting a set of rules and instructing the system to use those rules (and perhaps others) to generate a structural element and appropriately place that element in the structure design. For example, a user may select a cell and place one instance adjacent another instance of the same cell. The system, not the user, may recognize that the two adjacent elements each have a pillar in the same corresponding location (e.g., a shared corner). Using the rules carried by the cell definitions (and possibly additional system rules), the system may recognize that a single column is structurally sufficient for the two elements, and replace the two individual columns with a single column. Again, in this way a cell is not an element of a structure, but rather a basis for the system to generate elements that comprise the structure.

Certain aspects of a cell may be specified by these rules, while other aspects may be applied by design engine 52 when implementing the rules. For example, a rule may specify how the cell interacts with other cells in the design, such as how utilities (e.g., HVAC, electricity, water, data, and so on) are passed from one cell to the next. A rule may specify a size component (e.g., a dimension range for instances of a cell), a shape of cell (e.g., straight or rounded sides), a structural members component (e.g., how and where structural members such as columns are located), an interconnection component (e.g., where a cell may connect to another cell), a supplier identification component (e.g., specific suppliers for elements of the cell), an availability component (e.g., are elements specified in the cell readily available or do they take a longer than normal time to obtain), a cost component (e.g., what is the total cost of the elements specified for the cell), a health component (e.g., what level of exposure to specified substances will an occupant of a structure defined by the cell experience), an environmental efficiency component (e.g., energy use per cell), and so on. While some aspects of the cell may be rigidly defined by these rules, others may be adjusted to fit the design. For example, a cell may have a size range as opposed to an absolute size, allowing the system to choose a cell having a size range appropriate for the location.

Figure 3A:
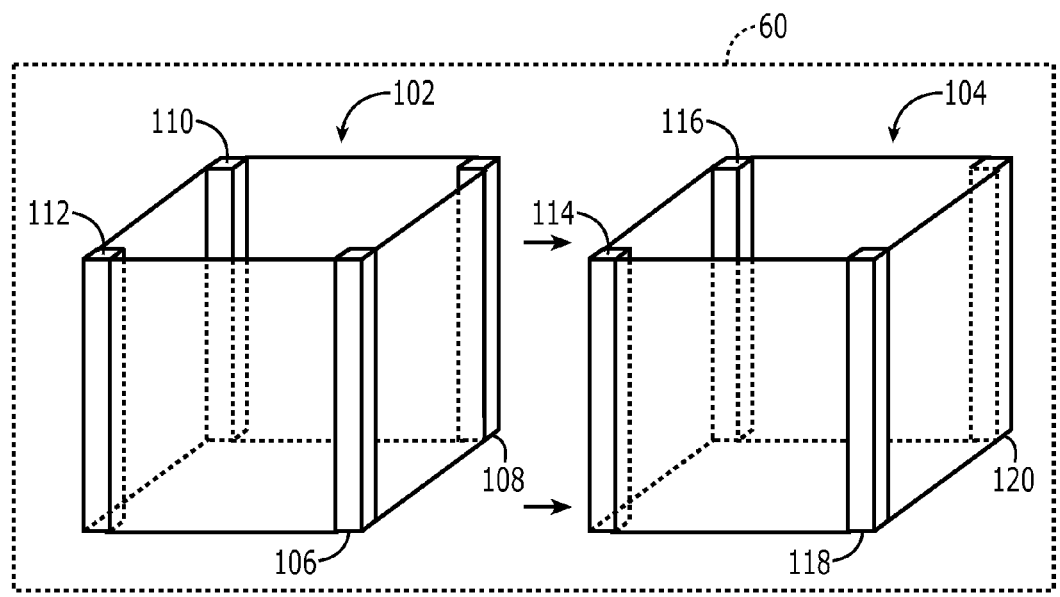
FIGS. 3A and 3B are perspective views of two instances of cells, prior to and following the bringing together of those two instances, respectively, according to a system of the type that may be employed in the present disclosure.
Figure 3B:
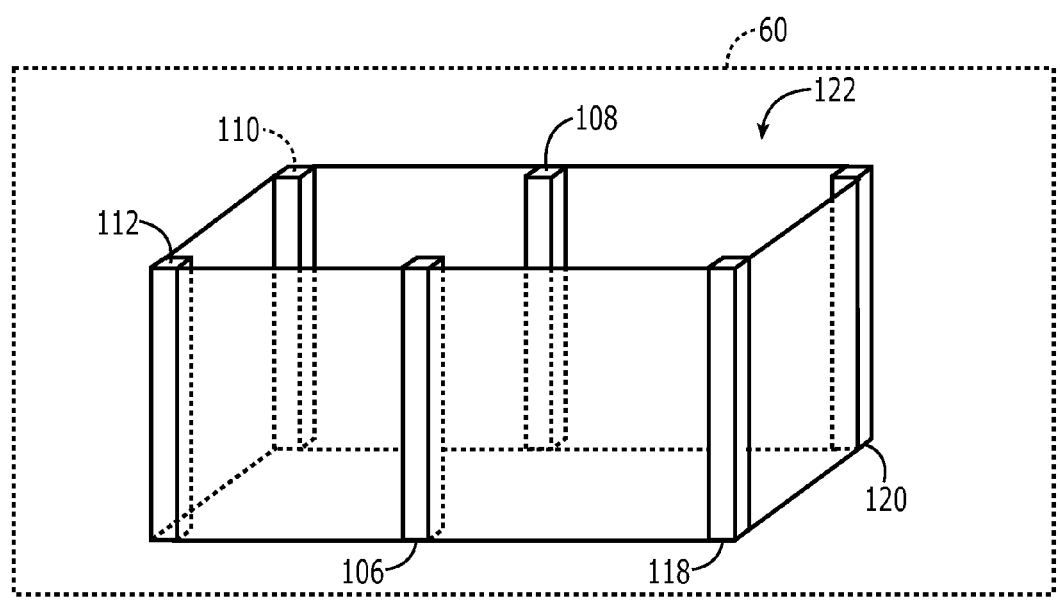

The rules provided by cell and structure data database 54 may have structural aspects, which are interpreted by design engine 52 to develop the structure. For example, one set of rules may require that a cell be supported at its corners by columns. In populating the footprint, two cells placed side-by-side may each be defined by such a rule. This is illustrated for cells 102, 104 in FIG. 3A. Cell 102 initially (at least conceptually) is provided with pillars 106, 108, 110, and 112. Similarly, cell 104 is provided with pillars 114, 116, 118, and 120. When assembled together by design engine 52 cells 102 and 104 are combined together into cell combination 122 (two adjacent cells) shown in FIG. 3B. In the process, it is determined that pillars 106 and 114 would be structurally redundant. Similarly, it is determined that pillars 108 and 116 would be redundant. Design engine 52 then executes a rule resulting in removal of one set of the redundant pillars from the design, leaving the other to adequately support the structure. Alternatively, all redundant pillars may be removed and replaced by new structural members suited to support the instance of the new cell (e.g., larger columns replace each of columns 106, 108, 114, and 116). This is implemented by design engine 52 (FIG. 2) and rendered in design workspace 60, for example as illustrated in FIG. 3B, in which cells 102 and 104 have been combined into new cell 122, and further in which pillars 114 and 116 have been removed, leaving pillars 106 and 108 as supports in the new cell structure. As definitions, cells carry with them the rules that govern how they connect to one another, how they affect the structure when making those connections, and so on. Many other such rules, such as rules governing conduits and connections for water, air, electricity, data and voice, and the like, are provided by cell data database 54 to permit a relatively complete and efficient population of the structure.

Within the context of a design system, a user with a design focus initially makes certain design selections, such as those relating to structure shape, orientation, look and feel, and so forth. The system itself may execute many of the layout, infrastructure, material selections, and so forth to populate the design initiative by the user, particular for repetitive portions of the structure. The user may then override design point decisions implemented by the design system. The goal is to relatively quickly and efficiently arrive at the layout, specifications, material, vendor, and service provider selections, and other matters required to obtain approval for and begin construction of the a structure. Additional elements of and mechanisms for structure development, design, and implementation may be found in the aforementioned U.S. patent application Ser. No. 13/112,727.

Given the relatively rapid progression from concept to implementation of a structure design, and the ability to override decisions of the design system, there is a fundamental need for those parties involved in the various aspects of the design process to have appropriate skill and experience with the design process and design system. The specific parties and the extent that they are permitted to interact with system 50, such as entering the various inputs to design engine 52, editing the design at user interface 62, editing attributes at user interface 70, selecting optimization criteria at optimization interface 72, etc. must be carefully controlled. A balance must be maintained between ease of use of system 50, so that an efficient design process may be implemented, and limitations on modifications to designs, so that design integrity, safety, consistency, and so on may be ensured.

Figure 4:
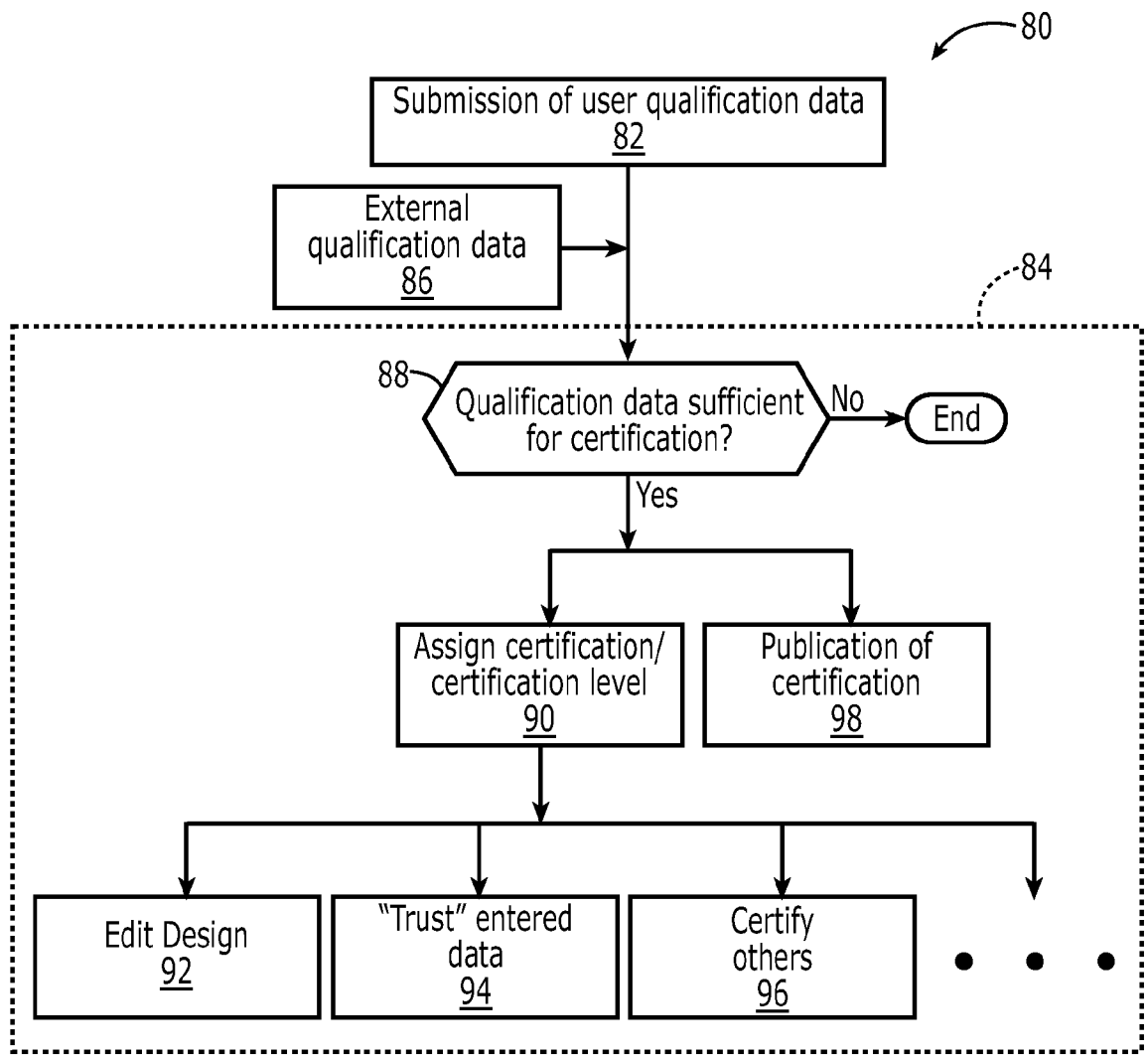
FIG. 4 is a flow chart illustrating the general steps of a method for certifying a user according to an embodiment of the present disclosure.

One method for maintaining this balance is through various certifications of users of system 80. With reference to FIG. 4, the general steps of a method 80 for certifying a user according to an embodiment of the present disclosure are shown. In a first step 82, qualification data are submitted to a certification subsystem 84, which may be a part of a design system. (Optionally, certification subsystem 84 may be separate from, but communicatively coupled to a design system.) Submission of qualification data (and conversely certification when certification is to be verified) may be in association with "user identification data." As used herein, user identification data are login credentials such as user name, password, biometric identification data, voice identification data, and so on, used to verify user identity. The qualification data are examined for satisfaction of certification criteria below, and satisfaction of certification criteria result in certification of the user, as described.

A very wide range of "users" may be certified by the certification subsystem 84. The present disclosure is focused on certification for a structure design system, so the user population extends to those involved in the structure design development, and implementation ecosystem. By way of example, this includes (but is not limited to) architects, engineers (e.g., civil, mechanical, structural, etc.), construction managers, component fabricators (raw materials and finished goods), data providers (e.g., surveyors, building code sources, and so on), component suppliers, trade professionals (e.g., plumbers, carpenters, etc.), real estate brokers, regulators, financers, insurers, and so on. Certification may be of an individual "user" or of an organization. "User" includes individuals, such an architect, that interface with the design system to design and implement a structure, as well as computer-based subsystems, such as a computer-based source for building code data.

A very wide range of certification criteria is contemplated herein, making an exhaustive list impossible. By way of example only, certification criteria may include but is not limited to: specific skill set, time spent in field, degrees obtained in field, certifications (other than for design system), design system training, design system examination (e.g., practical applications and problem solving), types of (and roles for) projects worked on using design system, length of apprenticeships using design system (and with whom apprenticed), number of individuals otherwise certified (e.g., in the case of firms and the like), adjudged quality of raw materials or finished goods produced and supplied, terms of service, and so on. Accordingly, the types and forms of qualification data in support of the certification criteria are commensurately broad and diverse.

For certain certifications or certain criteria, a user is permitted to submit qualification data directly to the certification subsystem 84, such as in response to questions provided by subsystem 84. For other certifications or criteria, a third party must submit qualification data to subsystem 84, at step 86. Such third party certification may be indirect, in that if a user is certified with an individual or organization (such as a governmental license, certification, etc.), then that user is also certified within an aspect of the design system. Qualification data may be written or demonstrative. In certain cases, the qualification data may be summary in nature, such as portfolio data. In other cases, the qualification data may be interactive, such as a practical demonstration of skill or an examination.

At step 88 the submitted qualification data is examined for satisfaction of the certification criteria. If the qualification data is sufficient to satisfy the certification criteria, the user may thereafter be certified. Certification therefore means or implies attestation to an established level of experience, competence, training, level of study, and the like, relevant to the design system. The attestation may be direct, in that subsystem 84 itself must first be satisfied (such as by demonstrating user time spent with a design system, passing an examination, etc.) in order to award certification. The attestation may also be indirect, in that if a user satisfies a third party's certification requirements (e.g., a professional or governmental license, certification, etc.), then that user is also certified within an aspect of the design system.

As discussed in more detail below, once certified, the user may be permitted access to aspects of the design system at step 90. Such access may include, but is not limited to, editing design data for a structure at step 92, entering new data or designs at step 94, be permitted to certify others at step 96, etc. In addition, according to some embodiments, once a user is certified the user's contact information, certification level, etc. may be made available to others, such as part of a database of qualified service providers a developer may search when initiating a building project, at step 98.

Figure 5:
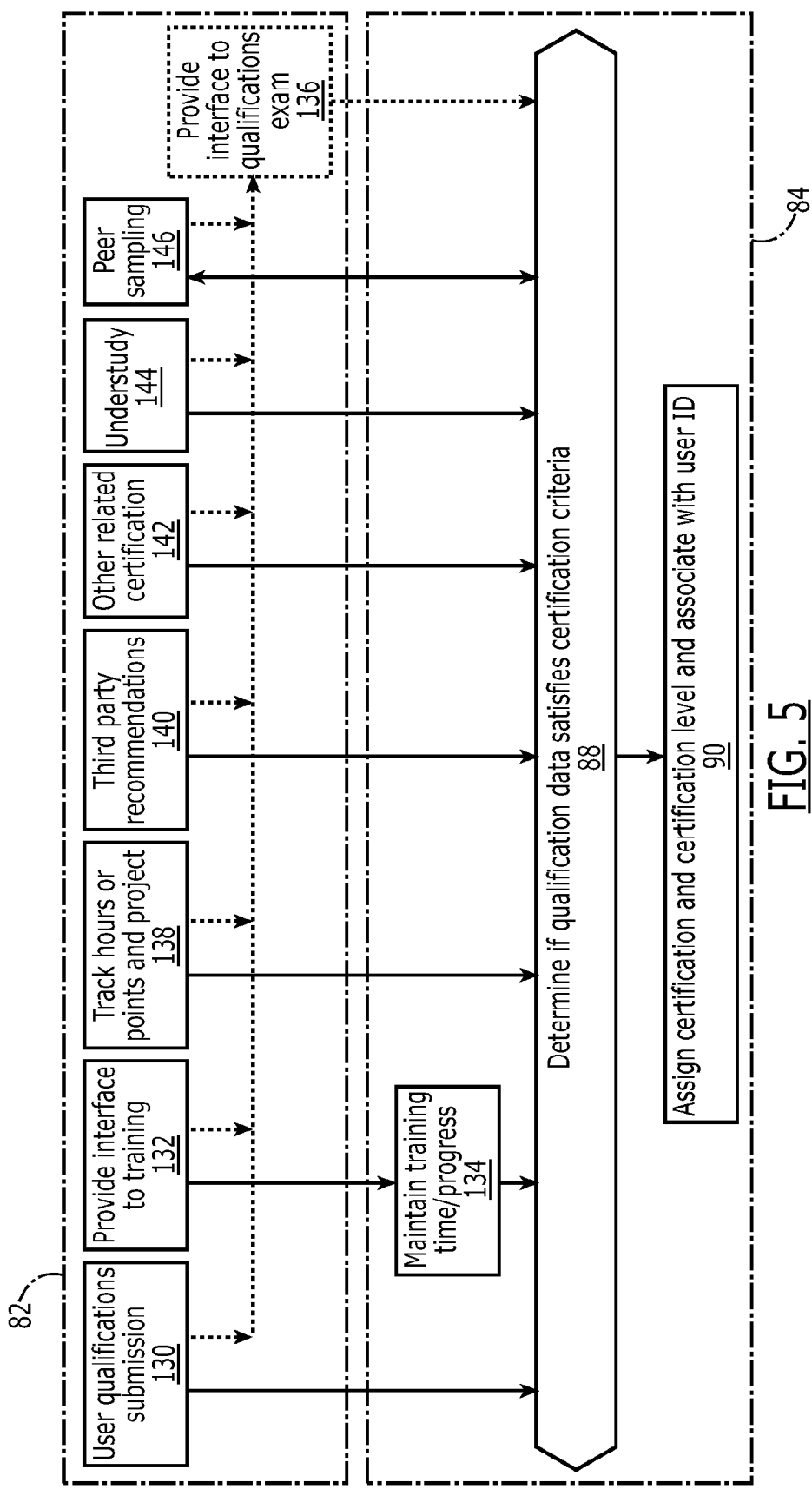
FIG. 5 is a flow chart illustrating the general steps of a method for evaluating user qualification data against certification criteria to determine user certification and certification level according to an embodiment of the present disclosure.

Various aspects of the process of FIG. 4 are illustrated in greater detail with regard to FIG. 5. Specifically, a variety of user qualification data are contemplated by the present disclosure, whereby one or more of such data may be evaluated against certification criteria as previously discussed. For example, and without limitation, a user may submit personal information 130, such as may be found on a resume, personal statement, application, etc. The information may include relevant education, training, references, and so on. Such personal information 130 generally is independent from but relevant to the role or function a user is to perform with respect to the design system itself.

Satisfaction of certification criteria may be inferred, and certification granted in whole or in part based on such inference. For example, a user may attest to a certain number of hours spent on activities relevant and similar to activities they would perform in the context of the design system. Similarly, educational degrees, professional licenses or other certifications in fields relevant and similar to activities the user would perform in the context of the design system may form a basis for inferring satisfaction of design system certification criteria in whole or in part.

Another class of user qualification data is dependent on the design system itself. For example, a training subsystem of a design system may provide an interface at 132 permitting a user to participate in a training program associated with the design system. The training subsystem (or other system) may track and maintain the time spent by the user on the training, measure the percentage of the training completed, and so on at 134. A user proffers a user id to the design system (such as a login identification and associated password). Once the user is authenticated to the system, and as is otherwise well known, a training session may begin with retrieving the last point in the training for the user, monitoring progress through the training material, saving the end point of the current session for the next session, and so forth.

In addition, the training subsystem (or other system) may provide an examination at various points in the training to confirm that the user has acquired the desired skills. The examination may be question/answer style. In addition or alternatively, the examination may be a practical demonstration of skills or knowledge. The examination may be evaluated by the training subsystem, some other system, or by an individual or group of individuals. Successful completion of the examination may result in satisfaction of certification criteria, approval to proceed to subsequent sections of training, etc. In addition, a user may, in certain embodiments, be able to take examinations of the type discussed above independent of the aforementioned training. For example, certification criteria may be satisfied by attaining a certain achievement level on an examination independent of how or where training to support the examination was obtained.

Another form of system dependent user qualification data is hours spent using the design system and types of projects worked on using the design system. These may be entered at 138. In one embodiment of the present disclosure, a user proffers a user id to the design system (such as a login identification and associated password). Once the user is authenticated to the system, and as is otherwise well known, the time a user spends interfacing with the design system may be tracked by a timing subsystem. Alternatively, a user may enter hours spent with the design system, either verified by a third party or unverified.

In another alternative, a user is awarded a number of "points" for the type and scope of a project completed using a design system. This model may be similar in some respects to the Actors' Equity model (see www.actorsequity.org). For example, points may be awarded: on a structure-by-structure basis, such as points for each structure completed; on a project-by-project basis, such as points for each completed project within a structure (which comprises multiple projects); on portions of a project, such as having some other aspect of work within the design system selected or singed off by an authorized party; on a materials basis, such as having delivered a certain quantity (and/or quality) or materials pursuant to a system design; on a time basis, such points for an amount of time spent using the design system; and so on. A non-certified user must accumulate a certain number of points in order to obtain certification. A certified user may obtain additional points to increase their level of certification. The number of points may be retained and updated in a user's account.

Points may also be awarded for certain types of performance in the context of a design system. For example, a count may be made of the number of changes a user makes to a structure design (over-riding the defaults and what the design system has set up via design rules it implements) and the number of instances that such changes are both allowed and retained in some final version of the structure. Some basic examples include: one point may be awarded for each such retained change; the number of points being equal a multiple of the ratio of accepted changes to total changes, and so forth. (The implication being that a user with more experience with the system should have a higher ratio on this measure than someone who is not good at using the system).

Still another form of system dependent user qualification data is recommendations from third parties, which may be entered at 140. Recommendations may be as to overall skill, training or internship completed, project participation, quality of work or goods produced, and so forth for an individual in the process of being certified. Recommendations may also attest to an individual's holding of other relevant certifications, licenses, and so forth at 142. Recommenders may themselves be certified, or may be persons (or systems) independent of the design system.

Yet another form of system dependent user qualification data relates to an understudy model at 144. In on example, a user may interface with a design system only when a supervisory user is logged in at the same time. Again, time accepted changes, and other metrics may be used to evaluate the user's qualifications. In another example, a period maybe provided during which a user's certification is unknown (or not defined), yet the user is permitted freely interface with the design system with (or without) supervisory oversight. (A more concrete example may be the case of a new architect on a project and a developer accepting or rejecting changes the new architect makes.) Then, over time the certification subsystem can derive, by tracking user interactions with the design system, what the user could or should be or not be permitted (i.e., certified) to do. This may be in accordance with either or both what the user has chosen to do in the past (e.g., if the user has no history of editing an electrical schematic of a structure it may be assumed that they are not qualified to do so) and what actions, when the user did do them, were flagged by the system as violating a rule or restriction (or alternatively flagged by the supervisory user as "outside their certification area" and rejected as a result). Of course, it follows that successfully performed and accepted actions (e.g., editing an HVAC plan) may for the bases for certification to subsequently perform similar actions.

User qualification data may also be a hybrid between system dependent and system independent. For example, a user may serve as an understudy for or intern with a supervising certified user for a specified length of time and/or on specified types of projects, for example using the design system, at 144. The understudy or intern work may, but need not be, concluded with an examination or demonstration of skill and learning in order to satisfy the certification criteria. The supervising certified user might be required to evaluate the user within the context of the subsystem 84. Thus, the user works with the design system, but that work is evaluate outside of the system.

Yet another form of system dependent user qualification data is peer sampling 146, which may be utilized to determine the reputation and collect other information from third parties. Such third parties may include, but is not limited to, colleagues, professional contacts, peers, customers, clients, vendors and suppliers, instructors, etc. This sampling may be geographically limited, may be limited by type of structure being designed, may be limited by specific role in a design project, and so on (or may be a random sampling among an appropriate population).

Any one of the above user qualification submissions may be supplemented by an optional examination at 136. For example, a user may submit their qualifications via an appropriate interface at 130, and either in all cases or in cases based on the submitted qualifications, the user may be required to satisfactorily pass an examination at 136 in order to be certified. The examination may be of any form such as multiple choice, short answers, practical (such as actually demonstrating skills and knowledge in the context of a structure design exercise) and so on. In one embodiment, the examination is both provided and evaluated by the certification subsystem. In other embodiments, the examination may be given by the subsystem by evaluated out side of the subsystem, such as by an individual certified to evaluate such examinations and report the result to the subsystem.

A quantified rating, such as a score, number of stars, thermometer rating, and so on may be used, as a rating system. This form of rating may both serve as certification criteria as well as indicia of quality and the like independent from the certification process (e.g., social rating metric). In such a case, the number of stars, thermometer level, etc. associated with the user may be independently viewable by others, for example those looking to establish a relationship with the user similar to social networking review sites. In general, the quantified ratings may be the basis of certification, a part of the basis of certification, or completely separate from the certification criteria The sampling may be indicative of one or more aspects, individually or combined, of the user's qualifications relative to a design system. For example, a user may be rated separately for speed of execution, level of complexity in design, customer satisfaction, etc. Alternatively, each of these separate criteria may be combined into an overall qualification assessment.

As can be seen in FIG. 5, it may be the case that an element of subsystem 84 initiates the peer sampling 146 by sending an outgoing request. While not shown, other forms qualification data collection such as user submission 130, training 132, examination 136, time tracking 138, and so on may also be initiated or supplemented by way of a similar outgoing request.

Examination of qualification data for satisfaction of certification criteria at step 88 may be a manual process, such as requiring an appropriate individual's review and decision on qualification data (with subsequent indication within subsystem 84 of such decision). Examination may also be automated, such as where a computer software program is able to review qualification data independently make a determination whether certification criteria has been satisfied based thereon. Importantly, different groups of users, such as different professions or roles, may be certified differently, using different criteria, individual or machine approval, etc.

Many different methods are contemplated herein for evaluating qualification data for satisfaction of certification criteria. For example, various qualification data may be quantified (e.g., "points"). Qualification data may be substantively examined against certification criteria. For example, where a form or template is provided for a user to complete for a certain certification, the certification subsystem may examine the completed form to determine if sufficient responses were provided to support certification. For example, FIG. 6 illustrates a sample form 190 a certification subsystem may use to evaluate a user for certification. A number of fields 192 are provided that a user may complete as appropriate. The certification subsystem may extract the data entered in fields 192 and compare that data to certification criteria to determine whether the entered data is sufficient to support awarding certification. Of course, a more rigorous system of checks and verification are possible and a function of implementation of the present disclosure.

A more manual process contemplated hereby involves an approving party (such as an appropriately certified user) reviewing submitted qualification data and making an objective (or subjective) determination with regard to certification of a user. There may also be a hybrid process by which a portion of the evaluation of certification criteria is system-based, and part of the evaluation is approving party-based.

A user's certification may be periodically reviewed to ensure quality, current skills, customer satisfaction, and so on. Likewise, periodic recertification and/or continuing education requirements may be appropriate for certain skill sets, aspects of a structure design, and so. Recertification and/or continuing education may operate as described above. Optionally, the certification subsystem may keep track of expiration of a user's certification or the time within which a user must complete a certain amount of continuing education, and alert the user of the need for either or both.

Related to maintaining certification is user de-certification. This may occur for a wide range of reasons, but most typically implies a current lack of sufficient skill, quality or training. For example, if a user receives a relatively high percentage of downgraded ratings in response to a peer sampling 146, it may be inferred that the user's skills are not sufficient to support continued certification. In such a case, the user may be temporarily decertified pending satisfaction of additional certification criteria, or possibly permanently decertified. As another example, a certifying individual may simply determine that the current skill set of a user cannot continue to support the current level of a user's certification. A completed project may fail to meet professional standards, or otherwise evidence lack of sufficient skill or ability, resulting in decertification. Many other circumstances leading to decertification will be apparent from the present disclosure, and therefore the above list is merely illustrative and does not limit the scope of the present disclosure or claims appended hereto.

A number of the certification mechanisms described above rely on the accumulation of a certain number of hours of training or use of a specific design system. In such cases, it is possible for a subsystem of the design system to track the training or use autonomously. A number of the certification mechanisms described above rely on the accumulation of a certain number of "points" associated with use of a specific design system. In such cases, it is possible for a subsystem of the design system to track such points for a user autonomously. Similarly, a number of the certification mechanisms described above rely on taking and passing an examination or practical demonstration of skill with regard to a design system. In such cases, the examination may be resident on, administered by, and evaluated (e.g., graded) by a subsystem of the design system. The certification process may thereby be fully automated, and may but need not be fully within a design system. Alternatively, one or more individuals may review a user's qualification data to determine if the appropriate certification criteria have been satisfied, and if so, award the certification.

While a number of exemplary certification mechanisms have been discussed above, it will be appreciated that a great many additional certification mechanisms are possible and are contemplated by the present disclosure. The above are merely illustrative, and are not intended to limit the scope of the present description or appended claims.

Satisfaction of certification criteria may lead to one or more of a wide variety of types of certification. Certification may be with respect to performing a specific task within the context of a design system. For example, a user may be certified to do heating, ventilation and air conditioning (HVAC) ductwork layout. A user may be certified to edit aspects of a design, but another user with a superior certification must approve acceptance of the edits into the structure design. Certification may be with respect to project oversight and control. For example, a user may be certified as a "lead architect" within a design system for a specific structure. This level of certification may permit the user to initiate a design, edit a design, control the authority level of others to initiate and edit designs, certify others, transmit design details to third parties, and so on. Certification may be essentially universal, applicable in the context of any structure and in any location. This level of certification may permit the user to initiate a design, edit a design, control the authority level of others to initiate and edit designs, transmit design details to third parties, and so on. Certification may permit a user to instruct other users on use of a design system, and potentially to certify other users.

Certification may be specific to single design (such as a design in process) within a design system. Certification may be specific to certain versions of a design system. It may also be limited to a geographic region. For example, in areas of high seismic activity, specific certification for earthquake tolerant design may be needed. Certification may be limited to a certain type or style, size, cost, energy rating, etc. of a structure. A user may be certified at different levels for these different aspects of a structure as well. For example, a user may be certified as an expert for small to medium commercial structures, as a novice for large manufacturing structures, have 3 out of 5 stars for overall quality of work, and so on.

As suggested above, there may be a variety of levels within a class of certifications. That is, certification for a role or function within a design system may have multiple levels, such as levels of experience, responsibility, specific skill sets, and so forth. While myriad of certification levels, and titles for those levels, are possible and contemplated herein, in one example, certification within the title "architect" may be subdivided into apprentice, journeyman, lead, principle architect, etc. It may be required that a user begin with a base level of certification within a title, and through time spent with and projects completed within the design system, as well as possible satisfaction of certification criteria external to the design system, wok their way up through the levels within the title (i.e., all users start as an apprentice architect, and work up to journeyman, lead, etc. The levels within a title may be by structure type, size, location, etc. Therefore, as another example, ascending levels of certification under the title architect may be "commercial structures under 10 stories", "commercial structures, 10 to 50 stories", commercial structures taller than 50 stories" and variations. In still another example, certifications may follow other existing taxonomies, such as the "belt" system of the six-sigma business strategy (en.wikipedia.org/wiki/Six_Sigma), apprentice-journeyman system for carpentry and various trades, the many levels of the Microsoft .NET system, and so on.

Design systems of the type contemplated herein are configured such that a code or similar authentication of certification level is required in order to access and perform certain functions. The design system may allow a user to take only those actions within the subset of actions permitted for the level of the user's certification. In addition, the design system may be configured such that access and performance of certain functions by one user require entry of a code or similar authentication of certification level of another, more highly (or specially) certified user. In this way, automatic "supervision" of, for example, an apprentice or journeyman user may be facilitated. Furthermore, in this way aspects of satisfaction of certain certification criteria, such as time spent working within a design system under supervision of a certified user, may be tracked and maintained within a subsystem of the design system. In certain embodiments, certification will be a function of the type, stage or other attribute of the structure being designed. Accordingly, design systems (or auxiliary systems or subsystems) in these embodiments are configured to confirm the various relevant prerequisites associated with a user's certification.

Figure 7:
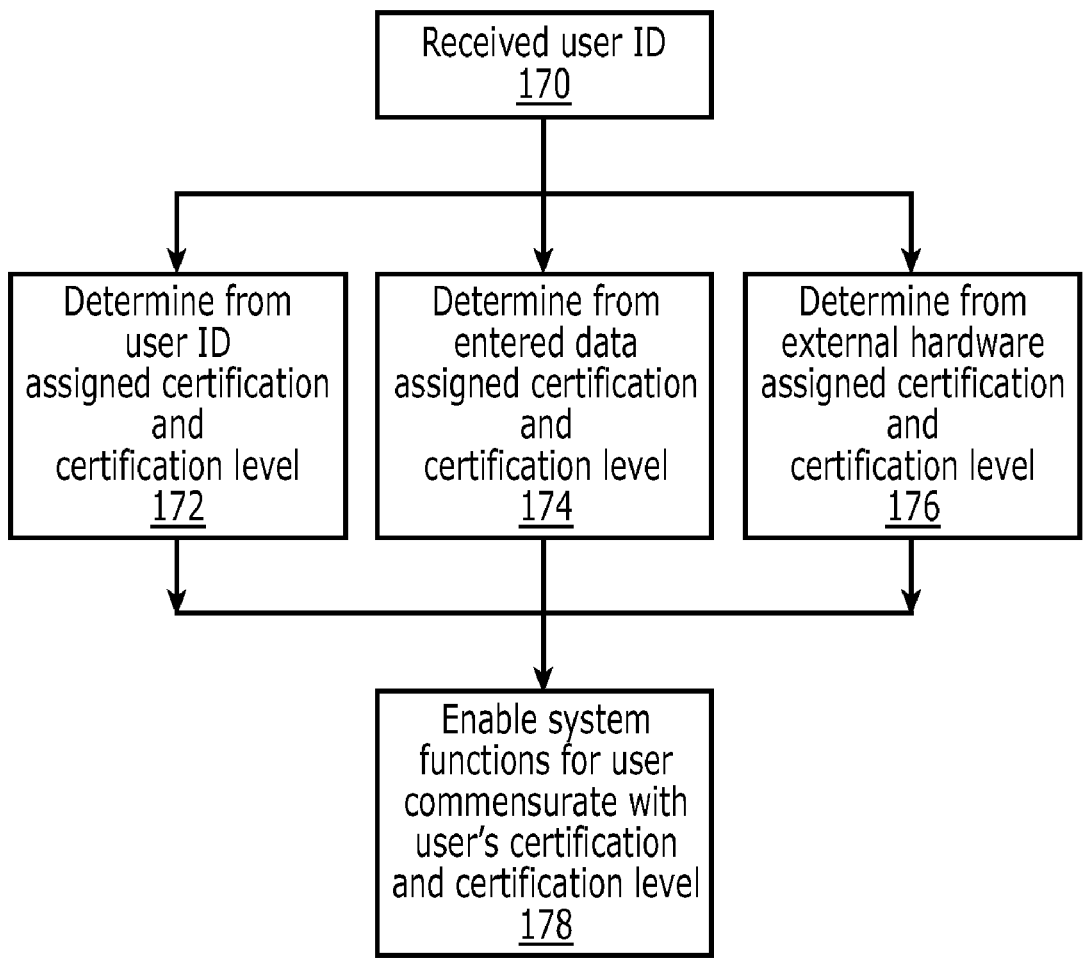
FIG. 7 is a flow chart illustrating a variety of methods that may be employed to deliver certification to a user and for the user to provide certification to a design system according to an embodiment of the present disclosure.

With reference to FIG. 7, a wide variety of methods may be employed to deliver certification to a user and for the user to provide certification to a design system. For example, a user's certification may be automatically associated with a user identification (id) used to sign in to the design system. That is, once a user id is entered at step 170, the certification and/or certification level may be determined therefrom at step 172, and thereafter appropriate interaction with the design system permitted at step 178. Alternatively, a user may be assigned a unique code, separate and distinct form any other user identification, that must be entered to authenticate their level of certification at step 174. A code may be written to an element of hardware, such as a proximity card, USB fob, and so on, that must be read by the design system in order to authenticate the user's level of certification at step 176.

As mentioned authentication of certification permits a user to take those actions within the context of a design system appropriate to that level of certification. A fundamental action that may be controlled via certification is access to a structure design. Maintaining designs as confidential is one application of such a certification limitation. The ability to publish a design for others to access is a subset of such certification control. The ability for a user to edit certain aspects of a structure design may be a function of certification type or level. For example, a user certified as an electrical systems specialist may be permitted to access, design, edit, etc. aspects of the electrical plan for a structure, but be precluded from doing so for other aspects of the structure design, such as plumbing.

Certification may provide a metric of trustworthiness to data provided by the user. For example, site data provided by a certified surveyor may be "trusted", whereas data provided by a non-certified surveyor may not be trusted (or trusted less), at least for purposes relevant to the design system. Similarly, component data, such as strength calculations for a beam provided by a certified beam vendor may be "trusted", whereas data about beams provided by a non-certified vendor may not be trusted (or trusted less) for purposes relevant to the design system.

Design systems of the type contemplated herein seek to shorten and simplify the process between design conception and design implementation. They may provide a "build it" button that essentially confirms that a design is complete and releases it to a build and other parties to initiate construction. Clearly, a very high level of certification is an appropriate prerequisite for "built it" authority.

In general, the various interactions with the design system controlled by certification will be specific to the functions a user performs, the structure being designed, rules defined by appropriate persons or groups of people, and so forth. Accordingly, functions that may enabled upon confirmation of an appropriate certification include but are not limited to: accessing an aspect of a structure design, creating an aspect of a structure design, viewing an aspect of a structure design, editing an aspect of a structure design, analyzing an aspect of a structure design, publishing an aspect of a structure design, approving an aspect of a structure design, certifying a user for interacting with a portion of a said computer-implemented system, inputting data into said computer-implemented system regarding components or services for use in an aspect of a structure design, editing data resident in said computer-implemented system regarding components or services for use in an aspect of a structure design, initiating implementation of an aspect of a structure design, and modifying said computer-implemented system.

In addition to stratifying user interactions with a design system, certifications may be searched, broadcast or made accessible to third parties, for example to identify an individual or an organization as a resource for structure design. A subsystem or system auxiliary to a design system may maintain a database of certifications, and publish selected ones of those certifications upon request. For example, a developer may request from an appropriate resource a recommendation for an architect certified for a commercial structure, of between 10,000 and 100,000 square feet, in Toledo, Ohio. The resource, which is a design system or an auxiliary system communicatively coupled to a design system may search its database of certified users for individuals or organizations appropriately certified, and provide names and contact information in reply to the request.

Conversely, a third party may post an opportunity for an individual or organization having a certain type or level of certification. For example, if the search of the previous example fails to return an appropriately certified user, the developer may post the opportunity for a wider audience or in the hope that a user who may soon obtain the preferred certifications will contact the developer.

Figure 8:
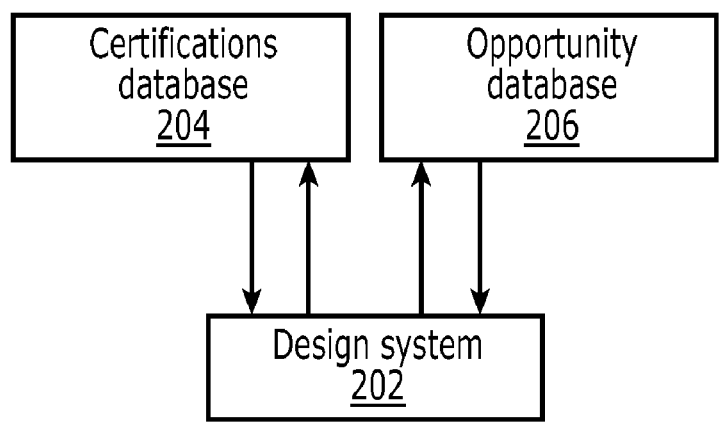
FIG. 8 is a flow chart illustrating the method of communication between a certifications resource and opportunities resource moderated by a design system according to an embodiment of the present disclosure.

In general, with reference to FIG. 8, a design system 202 may have access to (or maintain) both a list or database 204 of certifications (i.e., users and their certifications and/or certification levels) and a list or database 206 of opportunities seeking certified users. A clearinghouse may also collect the certifications lists and opportunities from various markets, communities, and the like and make them available and searchable. In this way, a design system network may be established linking certified individuals with appropriate opportunities.

Of course, appropriately certified individuals or organizations are able to announce their design system certification(s), and individuals or organizations may seek certified users independent of the design system. Check systems may be put in place to prevent fraud and misuse of certifications.

Figure 9:
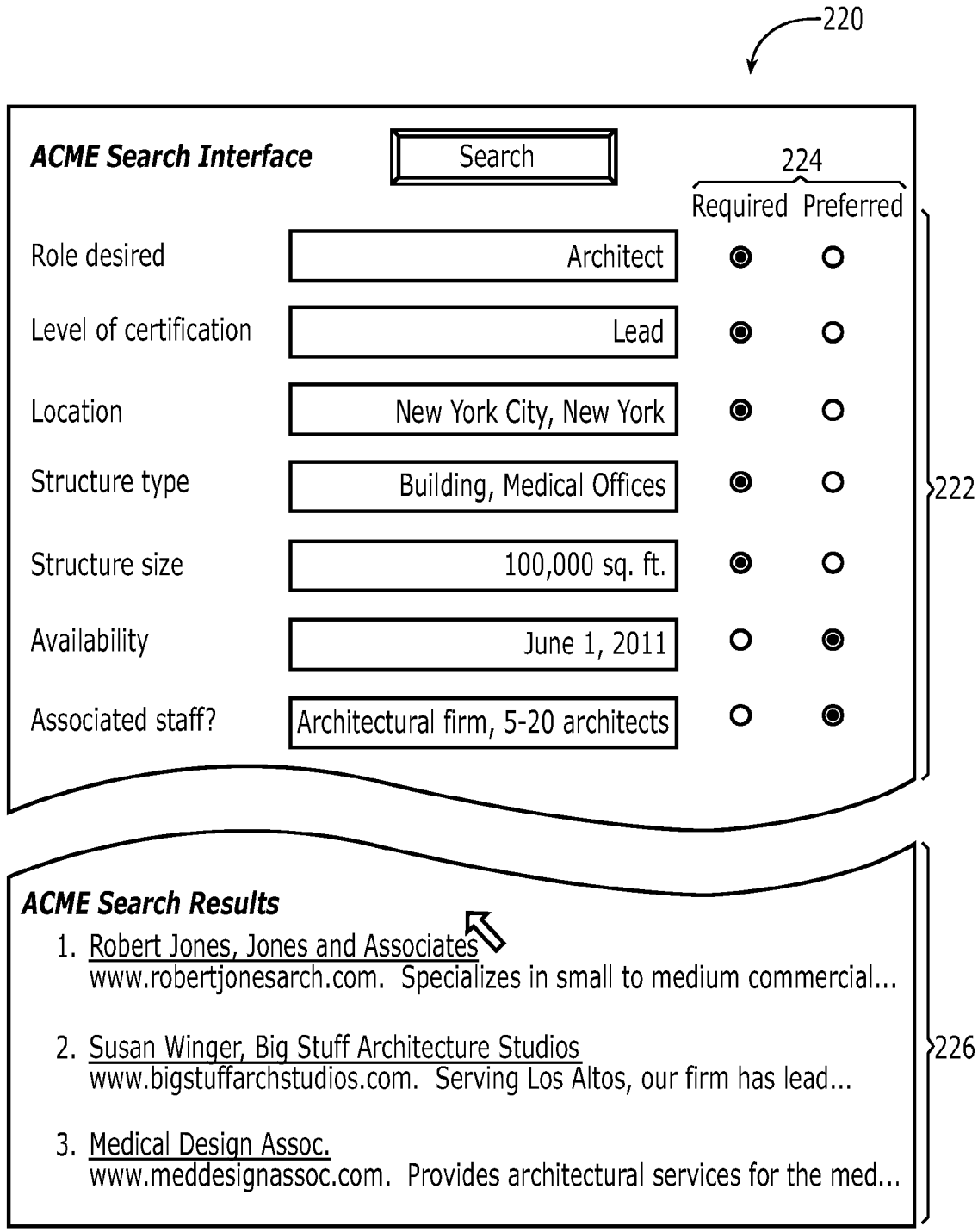
FIG. 9 is an exemplary search interface and search report in which an individual or organization may search for another individual or organization certified in the context of the design system according to an embodiment of the present disclosure.

Certifications may also be searched by an appropriate search resource (e.g., a search engine), for example using otherwise known searching techniques. FIG. 9 is an exemplary search user interface 220 facilitating such a search. A wide variety of search fields 222 may be provided (those shown in FIG. 9 are merely illustrative). Each search field may be selected to be required or preferred at 224. In certain embodiments, a search will be performed based solely on the input provided by the searching party, such as that shown in FIG. 9. In other embodiments, the search system can discover the searching party's preferences after performing a number of searchers. For example, when a user is logged using user identification data, searches performed will be examined for similar selections from search-to-search. These similarities may be assumed to be default (although editable) preferences for future searches. In addition to exact matches to a search, additional results such as suggestions for those with close but not exact certifications, such as certifications that are geographically "close", certifications above the requested certification level, certifications for similar structures, and so on may be provided. Of course, if no results match exactly, these additional suggestions may be provided, with or without an indication that no exact matches were found.

Ultimately, execution of the search provides a listing of professionals meeting all (or at least some) of the search criteria. The results may be listed hierarchically by relevance to the search, or otherwise, as known in the searching art, such as illustrated at 226. Of course, the search may operate in the opposite direction, so to speak, with certified professionals able to search for opportunities such as proposed building projects in desired markets. In one embodiment, in response to a search request, the subsystem may identify a team of certified providers (or at least for those roles that it maintains certified users for), permitting for example, a developer to quickly and easily assemble a team of certified individuals and/or groups for a project.

Privacy controls may be provided allowing certified users to opt out of the search functionality. Alternatively, search systems may be configured such that affirmative acts are required to permit individuals or organizations to opt in to make themselves available for searching.

Postings for positions (and likewise the ability to search for opportunities) may be limited by the certification held. The subsystem can thereby ensure that only qualified individuals and organizations are connected with appropriate opportunities.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A computer-implemented method for verifying and employing a user certification level in the context of a computer-based system for designing a structure and coordinating its implementation, comprising:
    receiving, in a first subsystem communicatively connected to a computer-implemented system for cell-based designing of a structure and coordinating its implementation, user identification data;
    determining, by and within said first subsystem, whether a certification has been previously awarded and associated with said user identification data by a certifying authority, or by said system, in response to a user associated with said user identification data either passing a certifying examination or demonstrating to a certifying authority experience using a design system; and
    enabling at least one function within said computer-implemented system for designing a structure and coordinating its implementation based on said determined certification associated with said user identification data.

2. The computer-implemented method of claim 1, further comprising:
    determining, within said first subsystem, a certification level associated with said user identification data; and
    said enabling of at least one function within said computer-implemented system for designing a structure and coordinating its implementation further based on said certification level associated with said user identification data.

3. The computer-implemented method of claim 1, wherein said enabling of at least one function within said computer-implemented system for designing a structure and coordinating its implementation is specific to a single design within said computer-implemented system.

4. The computer-implemented method of claim 1, wherein said enabling of at least one function within said computer-implemented system for designing a structure and coordinating its implementation is specific to a version of said computer-implemented system.

5. The computer-implemented method of claim 1, wherein said enabling of at least one function within said computer-implemented system for designing a structure and coordinating its implementation is specific to a geographic region in which a structure design is to be implemented.

6. The computer-implemented method of claim 1, wherein said enabling comprises enabling multiple different functions for different structure types being designed.

7. The computer-implemented method of claim 1, further comprising:
    receiving, in a second subsystem communicatively connected to said computer-implemented system for cell-based designing of a structure and coordinating its implementation, supervisory user identification data;
    determining, by and within said second subsystem, a supervisory certification associated with said supervisory user identification data; and
    enabling at least one function within said computer-implemented system for designing a structure and coordinating its implementation based on said supervisory certification associated with said supervisory user identification data.

8. The computer-implemented method of claim 1, wherein said at least one function is selected from the group consisting of: accessing an aspect of a structure design, creating an aspect of a structure design, viewing an aspect of a structure design, editing an aspect of a structure design, analyzing an aspect of a structure design, publishing an aspect of a structure design, approving an aspect of a structure design, certifying a user for interacting with a portion of a said computer-implemented system, inputting data into said computer-implemented system regarding components or services for use in an aspect of a structure design, editing data resident in said computer-implemented system regarding components or services for use in an aspect of a structure design, initiating implementation of an aspect of a structure design, and modifying said computer-implemented system.

9. The computer-implemented method of claim 1, wherein said user is a computer-based user subsystem.

10. A computer-implemented method for coordinating interactions in a computer-implemented system for cell-based designing of a structure and coordinating its implementation, comprising:
   storing, in memory communicatively connected to a computer-implemented system for cell-based designing of a structure and coordinating its implementation, certification data and an association between user identification data and said certification data, said certification data representing a level of certification previously awarded and associated with said user identification data by a certifying authority, or by said system, in response to a user associated with said user identification data either passing a certifying examination or demonstrating to a certifying authority experience using a design system;
   receiving, in a search resource communicatively connected to said system, a search request for a plurality of certification data;
   searching, by said search resource, said memory for certification data responsive to said search request;
   organizing, by said search resource, said certification data and said associated user identification data responsive to said search request;
   providing, by said search resource, said certification data and said associated user identification data organized in response to said search request to said system; and
   displaying, by said system, said certification data and said associated user identification data organized in response to said search request to said system.

11. The computer-implemented method of claim 10, wherein said search request comprises multiple data items, and further wherein said search resource provides an interface permitting designating each said data item as either required or as preferred.

12. The computer-implemented method of claim 10, further comprising:
   further organizing, by said search resource, additional certification data and user identification data associated therewith as suggestions associated with said search request;
   providing, by said search resource, said additional certification data and said associated user identification data as suggestions associated with said search request to said system; and
   displaying, by said system, said additional certification data and said associated user identification data as suggestions associated with said search request.

13. A computer-implemented method for coordinating interactions in a computer-implemented system for cell-based designing of a structure and coordinating its implementation, comprising:
   storing, in memory communicatively connected to a computer-implemented system for cell-based designing of a structure and coordinating its implementation, functions to be performed within the context of said system requiring a specified certification and a party associated with said functions to be performed, said specified certification representing a level of certification previously awarded and associated with said party by a certifying authority, or by said system, in response to said party either passing a certifying examination or demonstrating to a certifying authority experience using a design system;
   receiving, in a search resource communicatively connected to said system, user identification data;
   determining, in said search resource a certification associated with said user identification data;
   receiving, in said search resource, a search request for functions to be performed corresponding to said certification associated with said user identification data;
   searching, by said search resource, said memory for functions to be performed responsive to said search request;
   organizing, by said search resource, said functions to be performed and party associated therewith responsive to said search request;
   providing, by said search resource, said functions to be performed and party associated therewith responsive to said search request to said system; and
   displaying, by said system, said functions to be performed and party associated therewith responsive to said search request.

14. The computer-implemented method of claim 13, further comprising:
   storing, in said memory, certification data and an association between user identification data and said certification data;
   receiving, in said search resource, a search request for a plurality of certification data;
   searching, by said search resource, said memory for certification data responsive to said search request for a plurality of certification data;
   organizing, by said search resource, said certification data and said associated user identification data responsive to said search request for a plurality of certification data;
   providing, by said search resource, said certification data and said associated user identification data organized in response to said search request for a plurality of certification data to said system; and
   displaying, by said system, said certification data and said associated user identification data organized in response to said search request for a plurality of certification data to said system.

15. A computer system, including hardware elements, for designing a structure and coordinating its implementation and for verifying and employing a user certification level, comprising:
   a subsystem communicatively connected to a computer-implemented system for cell-based designing of a structure and coordinating its implementation for receiving user identification data;
   a subsystem for determining whether a certification has been previously awarded and associated with said user identification data by a certifying authority, or by said system, in response to a user associated with said user identification data either passing a certifying examination or demonstrating to a certifying authority experience using a design system; and
   a subsystem for enabling at least one function within said system based on said determined certification associated with said user identification data.

16. The computer system of claim 15, further comprising:
a subsystem for determining a certification level associated with said user identification data; and
said subsystem for enabling at least one function within said system further enabling said at least one function based on said certification level associated with said user identification data.

17. The computer system of claim 15, wherein said subsystem for enabling selectively enabling multiple different functions for different structure types being designed.

18. The computer system of claim 15, further comprising:
a subsystem for receiving supervisory user identification data;
a subsystem for determining a supervisory certification associated with said supervisory user identification data; and
said subsystem for enabling further enabling at least one function within said system based on said supervisory certification associated with said user identification data.

19. The computer system of claim 15, wherein said at least one function is selected from the group consisting of: accessing an aspect of a structure design, creating an aspect of a structure design, viewing an aspect of a structure design, editing an aspect of a structure design, analyzing an aspect of a structure design, publishing an aspect of a structure design, approving an aspect of a structure design, certifying a user for interacting with a portion of a said computer-implemented system, inputting data into said computer-implemented system regarding components or services for use in an aspect of a structure design, editing data resident in said computer-implemented system regarding components or services for use in an aspect of a structure design, initiating implementation of an aspect of a structure design, and modifying said computer-implemented system.

20. The computer method of claim 15, wherein said user is a computer-based user subsystem.

21. A non-transitory computer readable medium having computer program logic stored thereon, which is executable on one or more processors, for verifying and employing a user certification level in the context of a computer-implemented system for cell-based designing of a structure and coordinating its implementation, the computer program logic comprising:
computer program instructions for receiving in a first subsystem communicatively connected to a computer-implemented system for cell-based designing of a structure and coordinating its implementation, user identification data;
computer program instructions for determining whether a certification has been previously awarded and associated with said user identification data by a certifying authority, or by said system, in response to a user associated with said user identification data either passing a certifying examination or demonstrating to a certifying authority experience using a design system; and
computer program instructions for enabling at least one function within said computer-implemented system for designing a structure and coordinating its implementation based on said determined certification associated with said user identification data.

22. The non-transitory computer readable medium of claim 21, in which said computer program logic further comprises:
computer program instructions for determining a certification level associated with said user identification data; and
computer program instructions for enabling said at least one function within said computer-implemented system for designing a structure and coordinating its implementation further based on said certification level associated with said user identification data.

23. The non-transitory computer readable medium of claim 21, in which said computer program logic further comprises:
computer program instructions for receiving supervisory user identification data;
computer program instructions for determining a supervisory certification associated with said supervisory user identification data; and
computer program instructions for enabling at least one function within said computer-implemented system for designing a structure and coordinating its implementation based on said supervisory certification associated with said user identification data.

* * * * *